United States Patent [19]
Langley et al.

[11] Patent Number: 6,080,272
[45] Date of Patent: Jun. 27, 2000

[54] METHOD AND APPARATUS FOR PLASMA ETCHING A WAFER

[75] Inventors: Rodney C. Langley, Boise; David R. Johnson, Meridian; Willard L. Hofer, Boise, all of Id.

[73] Assignee: Micron Technology, Inc., Boise, Id.

[21] Appl. No.: 09/074,591

[22] Filed: May 8, 1998

[51] Int. Cl.[7] .................................. C23F 1/02; B23B 5/22
[52] U.S. Cl. ............................................. 156/345; 279/128
[58] Field of Search ............................... 156/345; 279/128

[56] References Cited

U.S. PATENT DOCUMENTS

| | | | |
|---|---|---|---|
| 4,859,304 | 8/1989 | Cathey et al. | 204/298 |
| 4,902,531 | 2/1990 | Nakayama et al. | 427/39 |
| 4,992,137 | 2/1991 | Cathey, Jr. et al. . | |
| 5,221,403 | 6/1993 | Nozawa et al. . | |
| 5,255,153 | 10/1993 | Nozawa et al. . | |
| 5,275,683 | 1/1994 | Arami et al. . | |
| 5,302,241 | 4/1994 | Cathey, Jr. . | |
| 5,310,453 | 5/1994 | Fukasawa et al. . | |
| 5,380,401 | 1/1995 | Jones et al. . | |
| 5,382,311 | 1/1995 | Ishikawa et al. . | |
| 5,460,684 | 10/1995 | Saeki et al. . | |
| 5,494,522 | 2/1996 | Moriya et al. | 118/719 |
| 5,539,179 | 7/1996 | Nozawa et al. . | |
| 5,556,500 | 9/1996 | Hasegawa et al. . | |
| 5,583,736 | 12/1996 | Anderson et al. . | |
| 5,605,603 | 2/1997 | Grimard et al. . | |
| 5,671,119 | 9/1997 | Huang et al. . | |

*Primary Examiner*—Benjamin L. Utech
*Assistant Examiner*—Matthew Anderson
*Attorney, Agent, or Firm*—Dickstein Shapiro Morin & Oshinsky LLP

[57] ABSTRACT

A plasma etching machine comprises a process chamber defining an interior region and including a bottom wall having an aperture and a block disposed in the aperture and including a longitudinally extending bore. A shaft extends through the bore and includes a spider push rod extending longitudinally therethrough. An internally cooled chuck is coupled to the shaft and disposed in the interior region and cooperates with the shaft to define a chamber. A spider is disposed in the chamber and is coupled to the push rod. A lift mechanism is coupled to the shaft and the push rod so that the spider pushes up on a wafer in response to actuation of the lift mechanism. A wafer clamping mechanism is coupled to the push rod if a mechanical clamp is used. In the case of electrostatic clamp the bias applied to the chuck is coupled with the use of a rotational roller to allow the bias to be applied to the chuck for the duration of the etch process. A RF source is needed for ionization of the gas. If the plasma etching machine has RF power applied through the bottom, then a rotational roller is used for this as well and must be isolated from the electrostatic voltage used to clamp the wafer. A drive motor is coupled to the shaft for rotating the shaft during a plasma etching process.

14 Claims, 5 Drawing Sheets

| FIG. 4A | FIG. 4B |

METHOD AND APPARATUS FOR PLASMA ETCHING A WAFER

The present invention relates to a method and apparatus for plasma etching a wafer and particularly to plasma etching a wafer using a rotatable chuck. More particularly, the invention relates to an internally cooled rotatable chuck for use in a plasma etching process.

BACKGROUND OF THE INVENTION

Plasma etching apparatus for processing wafers is known. Typically, a chuck serves as a lower electrode in a process chamber which can be set in a vacuum state. A wafer is placed on and fixed to the chuck, and then subjected to the plasma etching process. There are two commonly used ways of fixing a wafer to a chuck, mechanical supporting means such as a clamp, and an electrostatic chuck for attaching a wafer by means of an electrostatic attractive force. A typical electrostatic chuck includes a metallic base plate that is coated with a thick layer of slightly conductive dielectric material. A silicon wafer of approximately the same size as the chuck is placed on top of the chuck and a potential difference is applied between the silicon wafer and the base plate of the electrostatic chuck. This causes an electrostatic attraction proportional to the square of the electric field in the gap between the silicon wafer and the chuck face.

When the chuck is used in a plasma filled chamber, the electric potential of the wafer tends to be fixed by the effective potential of the plasma. The purpose of the dielectric layer on the chuck is to prevent the silicon wafer from coming into direct electrical contact with the metallic part of the chuck and shorting out the potential difference. On the other hand, a small amount of conductivity appears to be desirable in the dielectric coating so that much of its free surface between points of contact with the silicon wafer is maintained near the potential of the metallic base plate; otherwise, a much larger potential difference would be needed to produce a sufficiently large electric field in the vacuum gap between the wafer and chuck.

During plasma etching of pattern wafers, the plasma raises the temperature of the wafer to an undesirable level that could damage the wafer. Accordingly, the chuck must be kept as cool as possible. The current preferred method of cooling a plasma chuck is with conductive cooling of the backside of the chuck through the use of helium. The face of the chuck generally includes a pattern of grooves in which helium gas is maintained. This gas provides cooling by thermal contact between the wafer and the chuck. To contain the helium at the chuck and prevent it from escaping into the reaction, a clamp must be incorporated with the chuck to hold the wafer down.

In conventional pattern plasma etched apparatus, the chuck is stationary to allow for cooling. Non-uniform etching occurs, however, due to chamber design or process parameters resulting in undesirable film thickness deviations. These deviations in film thickness can be localized or spread across the entire film surface.

SUMMARY OF THE INVENTION

The present invention overcomes these shortcomings by providing an internally cooled rotatable chuck for use in a semiconductor wafer plasma etching apparatus. By rotating the chuck and the wafer in an etching chamber, the effect of the inherent lack or excess of ions due to chamber design or process parameters can be minimized. The lack or excess of ions creating the etch can be spread across the entire wafer surface assuring all locations see the same etch parameters. Accordingly, a more efficient process with better film uniformity will be realized.

According to the present invention, a plasma etching machine comprises a process chamber defining an interior region and including a bottom wall having an aperture and a block disposed in the aperture and including a longitudinally extending bore. A shaft extends through the bore and includes a spider push rod extending longitudinally therethrough. The shaft is supported for rotation in the bore. A controller controls the speed, direction and duration of the shaft rotation.

An internally cooled chuck is coupled to the shaft and disposed in the interior region and cooperates with the shaft to define a chamber. The chuck includes a clamp, either electrostatic or mechanical, for retaining the wafer on the chuck. The wafer can be retained on the chuck in a conventional face up orientation, an upside down orientation, or on its side within the process chamber.

A spider is disposed in the chamber and is coupled to a spider push rod. A lift mechanism is coupled to the shaft and the spider push rod so that the spider pushes up on a wafer in response to actuation of the lift mechanism. A drive motor is coupled to the shaft for rotating the shaft during a plasma etching process. A bellows assembly couples the shaft end to a coolant source. The lift mechanism includes a lift plate coupled to the bellows assembly, the lift plate and bellows assembly being movable between a wafer lifting position and a disengaged position, the spider push rod including a coolant passage in communication with the chamber and being movable in response to movement of the lift plate and bellows assembly.

Further according to the invention, a method for plasma etching a wafer comprises the steps of coupling a chuck to a pedestal, coupling the wafer to the chuck, rotating the pedestal, and etching the wafer.

The present invention provides a rotatable chuck for use with apparatus for plasma etching a wafer. The invention also provides a rotatable electrostatic chuck for use with apparatus for plasma etching a patterned wafer. The invention further provides a rotatable chuck having coolant passages for conveying coolant to the chuck.

These and other features and advantages of the invention will become apparent from the following detailed description of preferred embodiments.

DETAILED DESCRIPTION OF THE DRAWING

Figure 1:
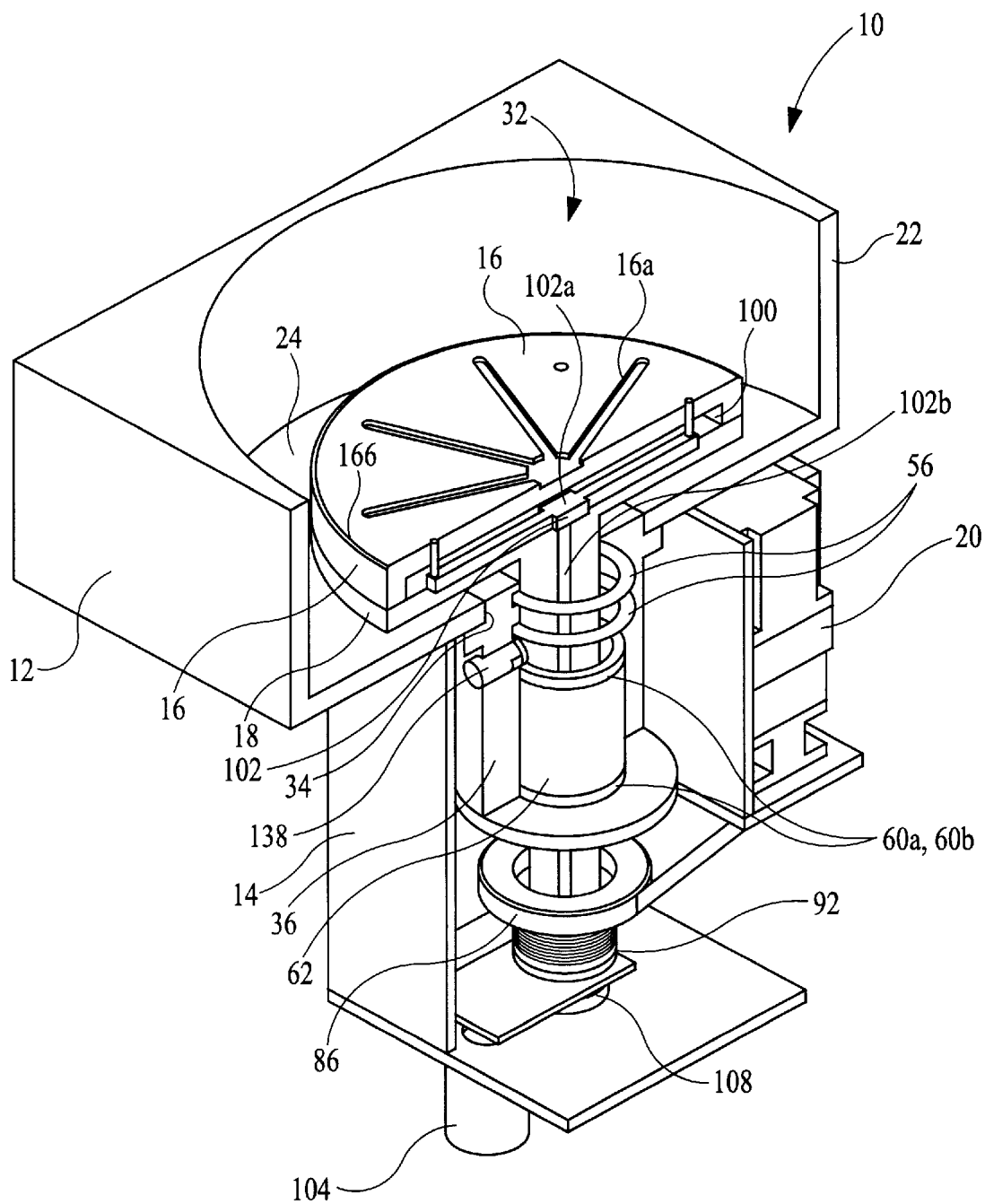
FIG. 1 is a perspective view of a plasma etching apparatus according to the present invention.
Figure 2:
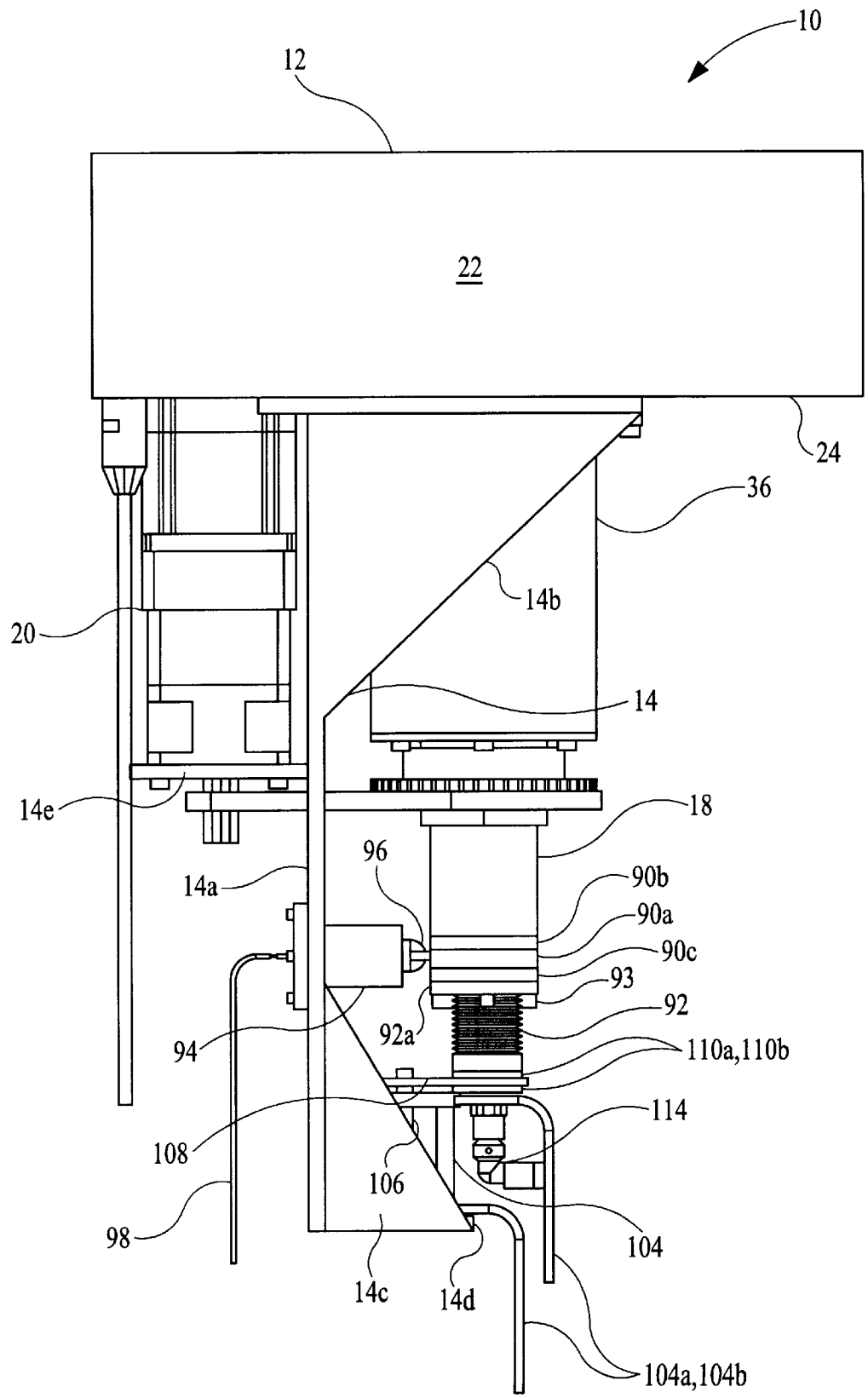
FIG. 2 is a side view of a plasma etching apparatus.
Figure 3:
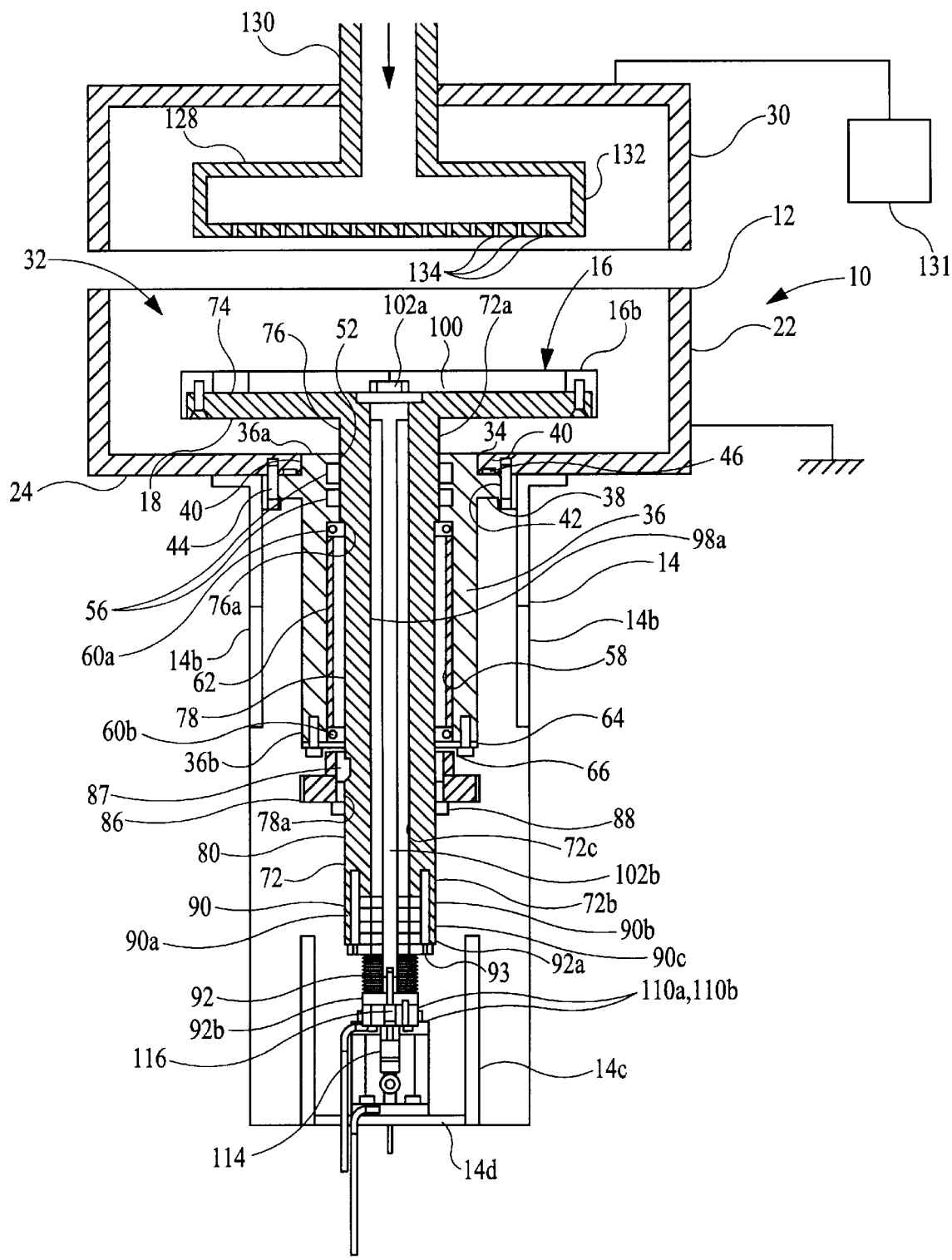
FIG. 3 is a front view of the apparatus of FIG. 2.

A plasma etching machine 10 for use in plasma etching pattern wafers is illustrated in FIGS. 1–3. The machine 10 includes a process chamber 12, a mounting assembly 14, a chuck 16, and a pedestal 18 coupled to the chamber 12 and mounting assembly 14. A drive motor 20 is attached to the mounting assembly 14 for rotating the chuck and pedestal 16, 18.

The process chamber 12 includes a plurality of sidewalls 22 and a bottom wall 24 and a dome 30 (FIG. 2) that cooperate to define an interior region 32. The bottom wall 24 includes a central aperture 34.

The mounting assembly 14, best seen in FIG. 2, includes a vertical member 14a, a pair of vertically oriented upper gussets 14b and a pair of vertically oriented lower gussets 14c projecting orthogonally from the vertical member 14a, and a pair of horizontally oriented mounting plates 14d, 14e projecting orthogonally from opposite sides of the vertical member 14a. The upper gussets 14b include flanges extending outwardly from the upper edges thereof for retaining the mounting assembly 14 to the bottom wall 24 of the chamber 12. The lower gussets 14c are attached to, and provide rigid support for, the mounting plate 14d. Mounting plate 14e supports the drive motor 20.

A cylindrical bearing and seal block 36 having a first end 36a and a second end 36b is disposed in the central aperture 34. The block 36 includes an angular flange 38 extending radially outwardly from the first end 36a. A radially outer surface 40 of the first end 36a and the flange 38 cooperate to define a shoulder that engages the central aperture 34. When so engaged, the flange 38 abuts the bottom wall 24 and extends between the upper gussets 14b. The flange 38 includes a plurality of bolt-receiving bores 42 evenly spaced around the flange. 38, and a plurality of bolts 44 attach the flange 38 to the bottom wall 24. An O-ring 46 is disposed between the flange 38 and the bottom wall 24. The block 36 further includes a central bore 52 extending longitudinally therethrough for receiving the pedestal 18. The bore 52 includes a pair of annular grooves at the first end 36a for receiving a pair of O-rings 56. O-rings 46 and 56 cooperate to seal the interior region 32. The bore 52 further includes an annular recess 58 extending longitudinally upwardly from the second end 36b. A pair of bearings 60a and 60b are disposed in the recess 58 and separated by a spacer 62. An annular bearing cap 64, attached to the second end 36b, retains the bearings 60a, 60b and the spacer 62 in position. An end play adjustment nut 66 threadedly engages the pedestal 18.

The pedestal 18 includes a cylindrical shaft 72 having a first end 72a and a second end 72b and a circular plate 74 attached to the first end 72a. The shaft 72 includes 3 sections 76, 78, 80. The first section 76 extends downwardly from the plate 74 to a first shoulder 76a that defines the beginning of the second section 78. The O-rings 56 in the block 36 engage the first section 76. The second section 78 includes a reduced outer diameter and extends downwardly from first shoulder 76a to shoulder 78a. The bearings 60a, 60b and spacer 62 engage the second section 78. A portion of the second section 78 extending from the second shoulder 78a includes threads to engage the end play adjustment nut 66. A pulley 86 is coupled to the second section 78 adjacent the second shoulder 78. A woodruff key 87 rotationally locks the pulley 86 to the shaft 72. The third section 80 extends from the second shoulder 78a to the second end 72b of the shaft 72 and includes a threaded portion adjacent the second shoulder 78a. A pulley lock nut 88 threadedly engages the portion of the treaded third section 80 adjacent the second shoulder 78a to axially retain the pulley 86 on the shaft 72. Thus, the pedestal 18 is free to rotate in the block 36, but is substantially axially fixed in the block 36.

The pedestal 18 further includes a conductive ring assembly 90 and a bellows assembly 92 attached to the second end 72b. The conductive ring assembly 90 includes a conductive ring 90a sandwiched between a pair of insulators 90b, 90c. O-rings provide a seal between the insulators 90b, 90c and the second end 72b and bellows assembly 92, respectively, and to the conductive ring 90a. The bellows assembly 92 includes an upper flange 92a and a lower flange 92b. A plurality of mounting bolts 93 extend through aligned apertures in the upper flange 92a, the conductive ring 90a and insulators 90b, 90c to attach the bellows assembly 92 and conductive ring assembly 90 to the second end 72b of the pedestal 18.

A plunger assembly 94, attached to the mounting assembly vertical member 14a, includes a electrostatic bias roller 96, such as a DC roller, that engages the conductive ring 90a. A high tension wire 98 couples the electrostatic bias roller 96 to a voltage source (not shown). An electrostatic lead 98a extends from the conductive ring 90a to the chuck 16 to provide electrostatic voltage to the chuck 16, causing the chuck 16 to become an electrode. An annular lip 16b, preferably made from a thin film insulator, extends around the periphery of the chuck 16. The lip 16b retains the wafer in a spaced relationship with the electrostatically charged chuck 16 and prevents the wafer from contacting the chuck 16.

A pneumatic lift actuator 104 is attached to the horizontal mounting plate 14e and includes air lines 104a, 104b and a lift piston 106. A lift piston 106 engages a lift plate 108 that engages the lower bellows flange 92b. The lower flange 92b includes a circumferential groove formed in the radially outer surface thereof. A pair of thrust washers 110a, 110b are disposed in the circumferential groove between the lift plate 108 and the lower bellows flange 92b. Actuation of the lift actuator 104 causes the bellows assembly 92 to move between a compressed upper position (not shown) and a relaxed lower position (FIGS. 2–3).

The pedestal 18 includes a longitudinal central bore 72c extending through the shaft 72 and plate 74. The chuck 16 is mounted to the top of the plate 74 and cooperates with the plate 74 to define a coolant chamber 100. A plurality of slots 16a formed in the face of the chuck 16 are in fluid communication with the chamber 100. A spider assembly 102 includes a spider 102a disposed in the coolant chamber 100 and a hollow lift rod 102b disposed in the central bore 72c. As the bellows assembly 92 moves in response to actuation of the lift actuator 104, the push rod 102b moves between a wafer unloading position, corresponding to the compressed position of the bellows assembly 92, and a wafer clamping position, corresponding to the relaxed position of the bellows assembly 92.

A rotational coupler 114 couples a helium source (not shown) to the lower bellows flange 92b and the pedestal 18. The rotational coupler 114 is coupled to a vented screw 116 that allows helium to pass from the rotational coupler 114 to the hollow lift rod 118. Thus, the rotational coupler 114 and the vented screw 116 move with the lift rod 118 in response to actuation of the lift actuator 104. The lift rod 118 conveys helium to the coolant chamber 100 and the slots 16a.

The dome 30 includes an upper electrode 128. The upper electrode 128 includes a gas inlet 130 and a header 132 formed to include a plurality of gas outlets 134. Preferably, the upper electrode 128 is made of a conductive material such as aluminum having an anodic oxide surface. The upper electrode 128 faces the chuck 16 which serves as a lower electrode. The lower electrode 16 is grounded and an RF source 138 (FIG. 1) is applied to the upper electrode 128 and provides energy to the interior region 32 to ionize the gas and form the plasma for etching the wafer.

Figures 4, 4A:
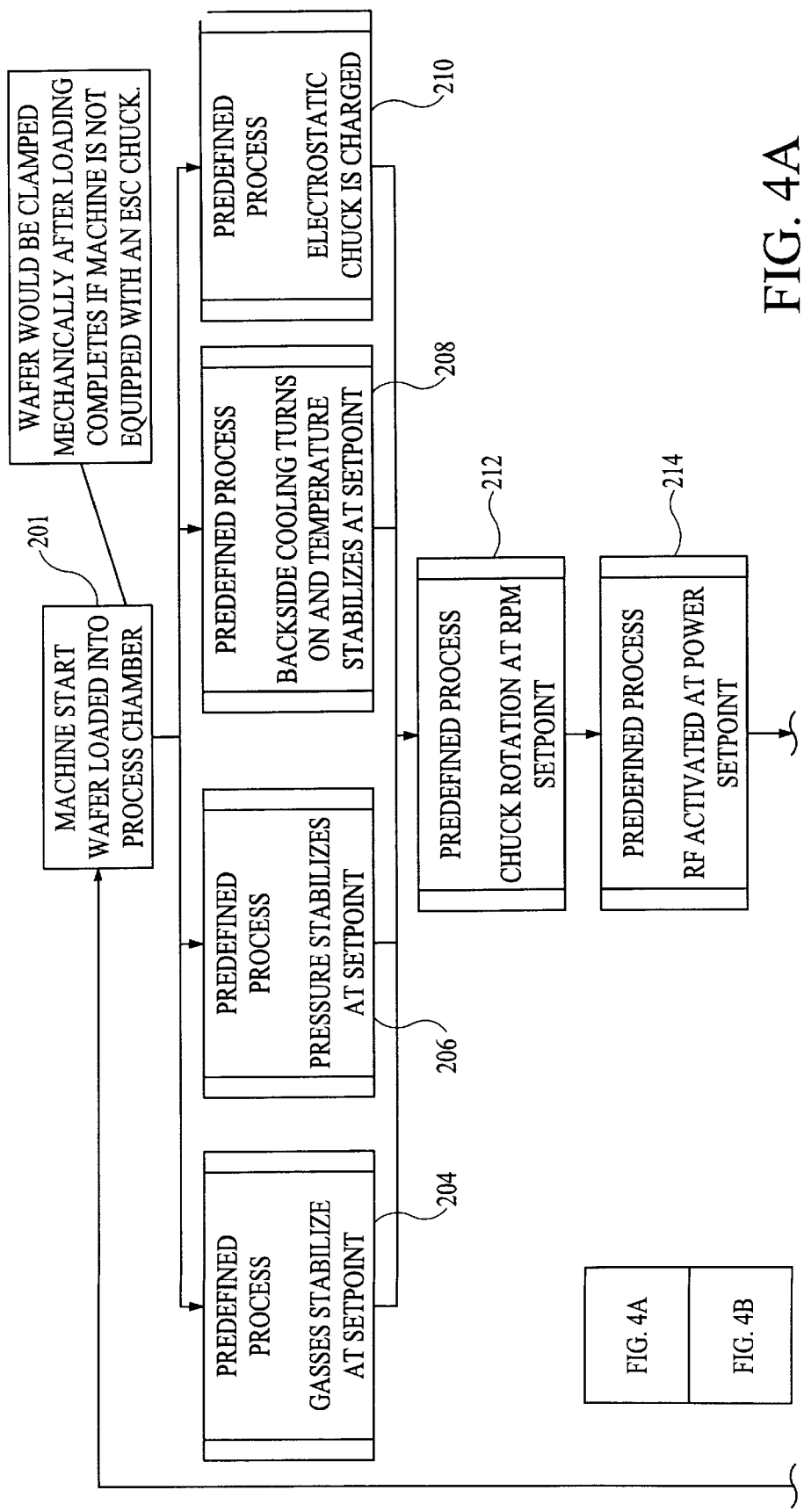
FIGS. 4, 4A, 4B are flow charts of a control process for controlling the apparatus of FIGS. 1–3.
Figure 4B:
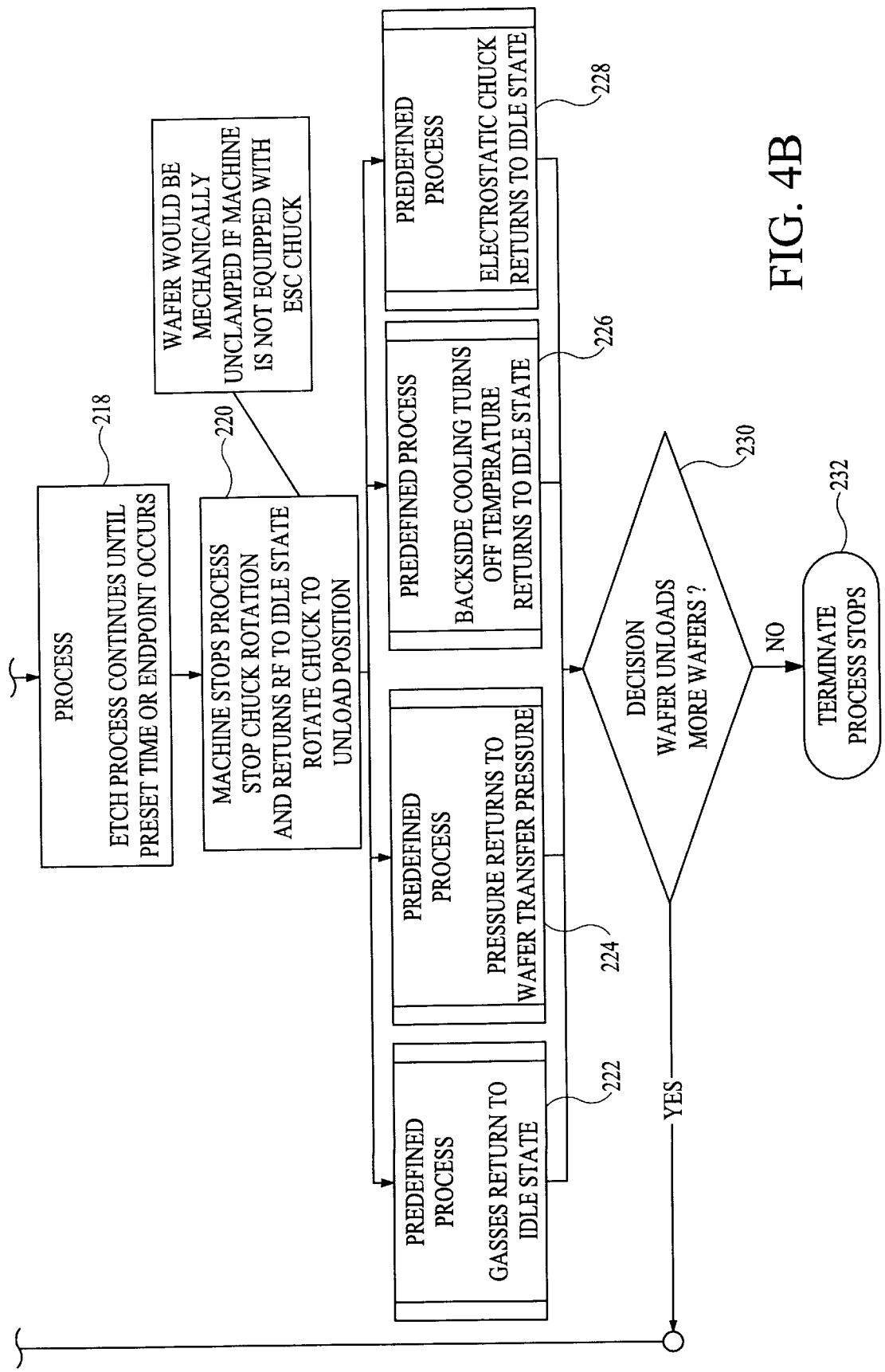

A representative plasma etching process is illustrated in FIG. 4. A wafer is loaded into the process chamber 12 and the machine 201 is started at step 201 to begin the process. Based on a predefined process, a controller 131 establishes process parameters. Initially, the controller 131 establishes a gas flow into the process chamber 12 at step 204. The gas enters through the gas inlet 130 and passes out of the header 132 through the outlets 134 into the process chamber 12. The controller 131 continues the gas flow 204 to establish a chamber pressure at a set point during step 206. Depending on the process involved, the gas flow can vary from less than 1 SCCM to a few SLM and the pressure can vary from a few millitorr to 2.5 torr and beyond.

The controller 131 also establishes backside cooling of the chuck 16 in step 208 by sending helium through the rotational coupler 114 and push rod 102b to the coolant chamber 122 and allows the temperature to stabilize. The controller 131 also energizes the ELECTROSTATIC BIAS ROLLER 96 to electrostatically charge the chuck 16 in step 210 and signals the drive motor 20 to begin pedestal rotation at a predetermined RPM at step 212. When all of the process parameters are stabilized, the controller 131 activates RF power by energizing the RF source 138 to generate the etching plasma at step 214. Power settings can vary, depending on the process involved, from a few watts to an excess of 2 megawatts. When the plasma is generated, the process continues until the expiration of a pre-set time or an end point occurs at step 218. At that point, the controller 131 stops the process, stopping the chuck rotation, rotating the chuck to the unload position, and deenergizing the RF source during step 220. The controller 131 also stops the gas flow at step 222 and returns the pressure, backside cooling, and electrostatic voltage to the idle state at steps 224, 226, 228, respectively. When the system is returned to the idle state, the controller 131 unloads the wafer at step 230 by signaling the lift actuator 104 to push up on the lift plate 108. The lift plate 108, in turn, pushes on the lift rod 102b and the spider 102a, which contacts the wafer and lifts the wafer from the chuck 16. At that point, during step 230, a new wafer can be loaded into the process chamber 12 and the process repeated, or the process can be terminated, as at step 232.

The present invention has been described with reference to an electrostatic chuck. It will be appreciated by those of ordinary skill in the art that a mechanical clamp can be used, although it is not preferred. A mechanical clamp adds more mass to the rotating pedestal and must be carefully machined to ensure that it is balanced about the rotational axis of the pedestal.

The above descriptions and drawings are only illustrative of the preferred embodiments which present the features and advantages of the present invention, and it is not intended that the present invention be limited thereto. Any modification of the present invention which comes within the spirit and scope of the following claims is considered part of the present invention.

What is claimed as new and desired to be protected by Letters Patent of the United States is:

1. A chuck assembly comprising:
   an internally cooled chuck;
   a clamp coupled to the chuck;
   a pedestal coupled to the chuck and having a central bore, a shaft and a longitudinal axis, the chuck and pedestal cooperating to define a coolant chamber that communicates with the central bore; and
   a drive motor coupled to the shaft for rotating the pedestal about the longitudinal axis.

2. The assembly of claim 1 wherein the clamp includes an electrostatic clamp.

3. The assembly of claim 2 wherein the electrostatic clamp includes an electrostatic bias roller disposed in contact with the shaft.

4. The assembly of claim 1 further comprising a spider disposed in the coolant chamber and a push rod coupled to the spider and disposed in the central bore, the push rod including a coolant passage in communication with the coolant chamber.

5. A chuck assembly for use with a plasma etching device, the assembly comprising:
   a chuck including a top surface having a plurality of slots;
   a pedestal coupled to the chuck and defining therewith a coolant chamber in communication with the slots, the pedestal having a longitudinally extending passage in fluid communication with the coolant chamber, the pedestal having a shaft and being rotatable about a longitudinal axis;
   a plurality of lift pins disposed in the coolant chamber and coupled to a longitudinally extending push rod disposed in the pedestal, the push rod including a coolant passage in communication with the coolant chamber; and
   an electrostatic clamp including an electrostatic voltage source coupled to the shaft.

6. The assembly of claim 5 further including a bellows assembly coupled to the pedestal and a lift actuator coupled to the bellows assembly, the push rod moving between a wafer unloading position and a wafer clamping position and the bellows moving between a compressed position and a relaxed position in response to movement of the lift actuator.

7. The assembly of claim 6 further including a rotational coupler coupled to the push rod and a source of coolant, the rotational coupler moving with the push rod in response to actuation of the lift actuator.

8. The assembly of claim 5 further including a block coupled to a process chamber, the pedestal being coupled to the block for rotation therein, the block including a plurality of bearings for supporting the pedestal during rotation and a plurality of seals, the seals cooperating with the pedestal to seal the process chamber.

9. A plasma etching machine comprising:
   a process chamber;
   a rotatable, internally cooled chuck disposed in the process chamber;
   a clamp coupled to the chuck; and
   a controller coupled to the process chamber and chuck for controlling gas flow and pressure in the process chamber and rotation of the chuck,
   a pedestal coupled to the chuck and cooperating therewith to define a coolant chamber, the pedestal including a coolant passage in fluid communication with a coolant source and the coolant chamber; and
   a lift actuator coupled to the coolant passage, the coolant passage moving in the pedestal in response to actuation of the lift mechanism to lift a wafer from the chuck.

10. A plasma etching machine comprising:
    a process chamber;
    a rotatable, internally cooled chuck disposed in the process chamber;
    a clamp coupled to the chuck; and
    a controller coupled to the process chamber and chuck for controlling gas flow and pressure in the process chamber and rotation of the chuck; and
    a pedestal coupled to the chuck, a block coupled to the process chamber, the pedestal being disposed in the block for rotation therein, and a bellows assembly coupled to the pedestal, the block, pedestal, and bellows assembly cooperating with each other to seal the process chamber.

11. A plasma etching machine comprising:

a process chamber;

a chuck disposed in the process chamber;

a clamp coupled to the chuck;

a pedestal coupled to the chuck and cooperating therewith to define a coolant chamber, the pedestal including a coolant passage in communication with the coolant chamber; and a drive motor coupled to the pedestal for rotating the pedestal during plasma etching; and a bellows assembly coupled to the pedestal and to a source of coolant, and a lift mechanism coupled to the bellows assembly, the lift mechanism including a lift plate coupled to a push rod disposed in the pedestal, the push rod including the coolant passage and being coupled to a plurality of lift pins, the lift pins lifting a wafer from the chuck in response to movement of the lift plate.

12. A plasma etching machine comprising:

a process chamber defining an interior region and including a bottom wall having an aperture;

a block disposed in the aperture and including a longitudinally extending bore;

a shaft extending through the bore and including a spider push rod extending longitudinally therethrough, the shaft being supported for rotation in the bore;

a chuck coupled to the shaft and disposed in the interior region, the chuck cooperating with the shaft to define a coolant chamber;

a spider disposed in the coolant chamber and coupled to the spider push rod;

a lift mechanism coupled to the spider push rod, the spider pushing up on a wafer in response to actuation of the lift mechanism; and a drive motor coupled to the shaft for rotating the shaft during a plasma etching process.

13. The machine of claim 12 wherein the block includes a plurality of bearings for supporting the shaft for rotation in the block and a plurality of seals for sealing the process chamber.

14. The machine of claim 12 further comprising a bellows assembly coupled to the shaft and to a coolant source, the lift mechanism including a lift plate coupled to the bellows assembly, the lift plate and bellows assembly being movable between a wafer lifting position and a disengaged position, the spider push rod including a coolant passage in communication with the chamber and being movable in response to movement of the lift plate and bellows assembly.

* * * * *